US012568610B2

(12) United States Patent (10) Patent No.: US 12,568,610 B2
Hsu et al. (45) Date of Patent: Mar. 3, 2026

(54) ELECTRONIC DEVICE AND SHIELDING STRUCTURE

(71) Applicant: WISTRON NEWEB CORPORATION, Hsinchu (TW)

(72) Inventors: Tiao-Ming Hsu, Hsinchu (TW); Jen-Yung Chang, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 245 days.

(21) Appl. No.: 18/358,060

(22) Filed: Jul. 25, 2023

(65) Prior Publication Data

US 2024/0357780 A1 Oct. 24, 2024

(30) Foreign Application Priority Data

Apr. 19, 2023 (TW) ................................. 112114467

(51) Int. Cl.
*H05K 9/00* (2006.01)
(52) U.S. Cl.
CPC .................................. *H05K 9/0024* (2013.01)
(58) Field of Classification Search
None
See application file for complete search history.

(56) References Cited

U.S. PATENT DOCUMENTS 5,844,784 A * 12/1998 Moran ................. H05K 9/0032
174/385
2002/0166683 A1* 11/2002 Shlahtichman ...... H05K 9/0032
174/363

2003/0062179 A1* 4/2003 West .................... H05K 9/0032
174/385
2007/0094977 A1* 5/2007 Zuehlsdorf .......... H05K 9/0032
52/480
2013/0048369 A1* 2/2013 Malek .................. H05K 9/0032
29/592.1
2015/0245543 A1* 8/2015 Jang ..................... H05K 9/0032
361/818

FOREIGN PATENT DOCUMENTS

TW 553588 U 9/2003
TW I787855 B 12/2022

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

An electronic device includes a circuit board and a shielding structure disposed on the circuit board is provided. A soldering portion is disposed on a surface of the circuit board. The soldering portion includes two pads. The shielding structure includes a shielding frame and a shielding cover. The shielding frame is disposed on the circuit board. The shielding frame includes a border frame, and the border frame is soldered to the two pads. The border frame includes a solder stopper. The solder stopper includes two notches. The two notches are between the two pads. The shielding cover is disposed on the shielding frame. As such, the overall height of the shielding structure can be reduced and the interference between the shielding structure and the solder material on the soldering portion can be improved.

16 Claims, 9 Drawing Sheets

ELECTRONIC DEVICE AND SHIELDING STRUCTURE

CROSS-REFERENCE TO RELATED PATENT APPLICATION

This application claims the benefit of priority to Taiwan Patent Application No. 112114467, filed on Apr. 19, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device and a structure, in particular to a shielding structure that can reduce overall height and block tin overflow, as well as an electronic device including the shielding structure.

BACKGROUND OF THE DISCLOSURE

Electronic components inside electronic devices generate electromagnetic waves during operation, which may influence the signal transmission and performance of other electronic devices. In order to reduce electromagnetic interference, a shielding cover made of conductive material is usually installed around the electronic device to absorb electromagnetic waves and achieve electromagnetic shielding.

Since existing electronic devices have a slim and lightweight design, the appearance of the shielding cover also follows this trend. A frame is first set up on a circuit board of the electronic device through soldering, and then the shielding cover is assembled on the frame to be fixed to the circuit board. However, when the miniature shielding cover is assembled on the frame, it is easily interfered with by overflowed solder material, causing difficulties in assembly. Traditional castle notches and pads of the circuit board (PCB pads) have size matching requirements (such as the size of the notch is similar to that of the solder pad and they are aligned to fit together). In other words, there is a need for the castle notches to have a certain size, making it difficult for the frame to achieve a miniaturized design.

Therefore, how to overcome the above-mentioned defects through structural design improvement has become one of the important issues to be solved in the field.

SUMMARY OF THE DISCLOSURE

The present disclosure mainly provides an electronic device and a shielding structure to solve the technical problem in the prior art where the miniaturization of the shielding structure makes it prone to be interfered by overflowing solder material during assembly.

To solve the technical problem as mentioned, one technical solution adopted by the present disclosure is to provide an electronic device, which includes a circuit board and a shielding structure disposed on the circuit board. The circuit board has a soldering portion, which includes two pads. The shielding structure includes a shielding frame and a shielding cover. The shielding frame is disposed on the circuit board. The shielding frame includes a border frame, and the border frame is soldered to the pads. The border frame includes a solder stopper. The solder stopper includes two notches. The two notches are between the two pads. The shielding cover is disposed on the shielding frame.

Another technical solution adopted by the present invention to solve the technical problem as mentioned is to provide a shielding structure disposed on the circuit board. A soldering portion is disposed on the surface of the circuit board. The soldering portion includes two pads. The shielding structure includes a shielding frame and a shielding cover. The shielding frame is disposed on the circuit board. The shielding frame includes a border frame soldered to the pads. The border frame includes a solder stopper. The solder stopper includes two notches. The two notches are between the two pads. The shielding cover is disposed on the shielding frame.

One advantageous effect of the present disclosure is that the electronic device and the shielding structure provided by the present disclosure can prevent interference from solder materials on the pads during assembly by the structure characteristic of two notches located between the two pads, which block the solder material from interfering with the shielding cover.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
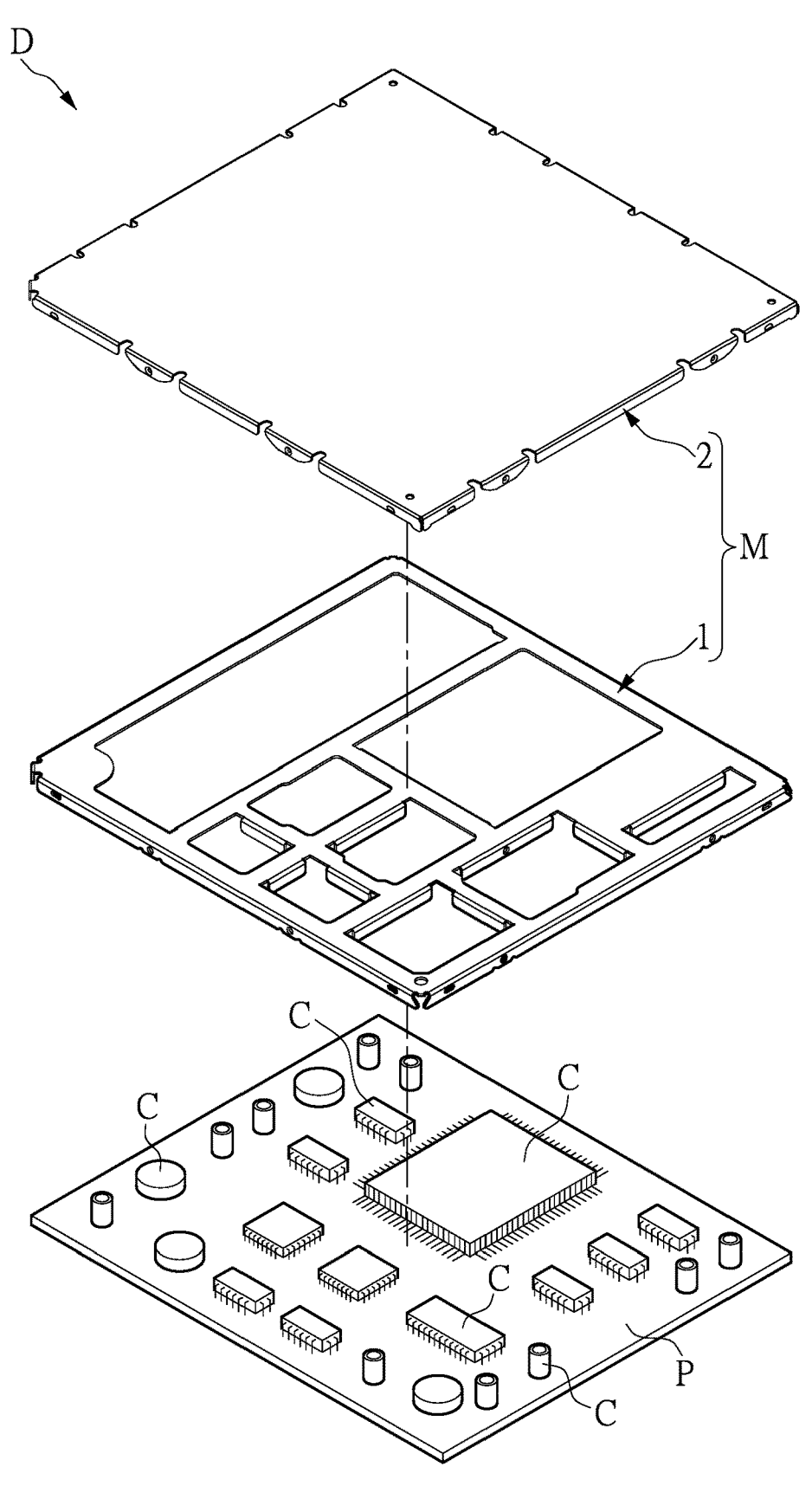
FIG. 1 is a schematic exploded view of an electronic device of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Embodiments

Figure 2:
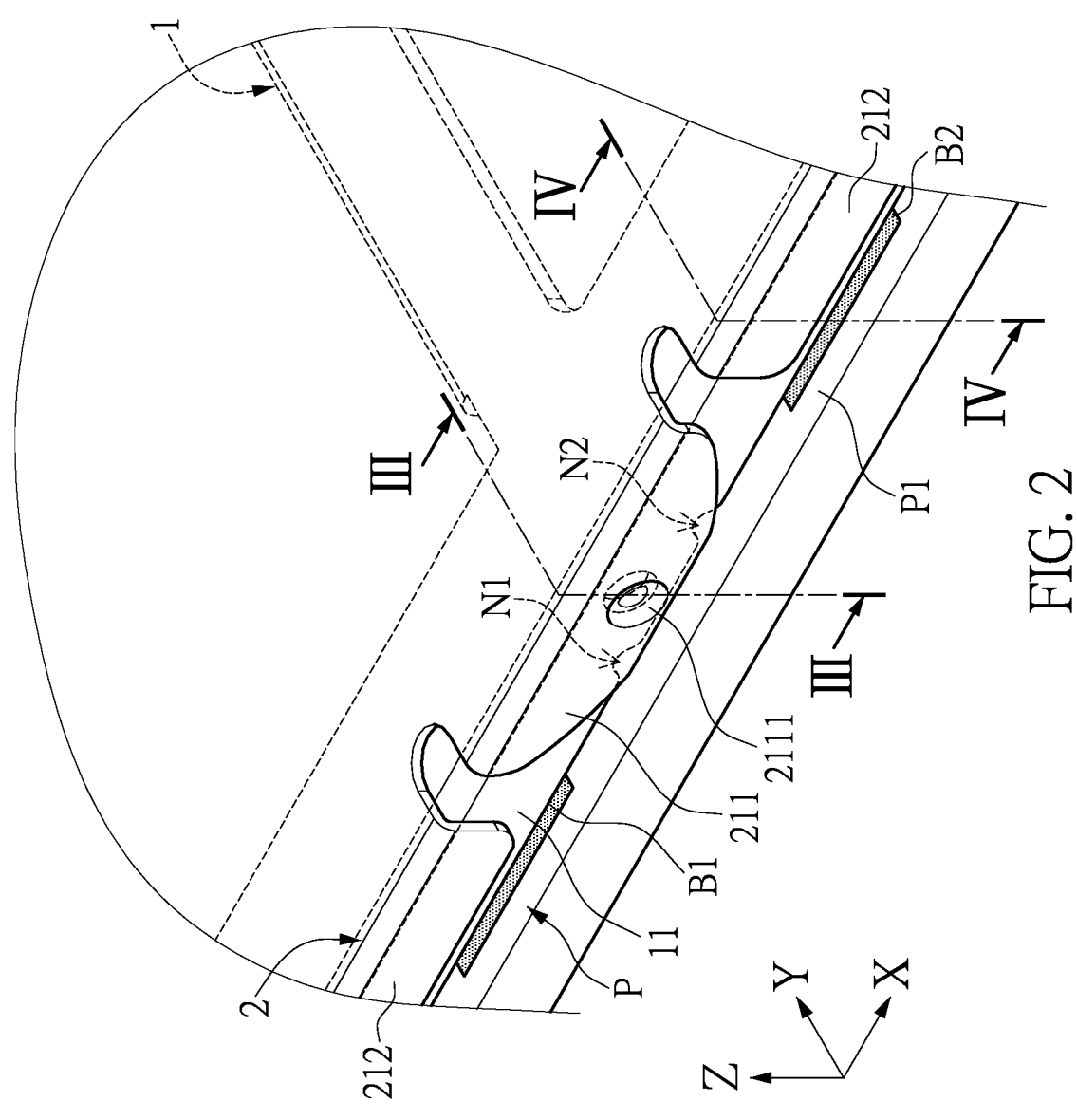
FIG. 2 is a schematic enlarged partial view of a shielding structure and a circuit board of the present disclosure.

Refer to FIG. 1 and FIG. 2. FIG. 1 is a schematic exploded view of an electronic device of the present disclosure. FIG. 2 is a schematic enlarged partial view of a shielding structure and a circuit board of the present disclosure. The present disclosure provides an electronic device D which includes a circuit board P and a shielding structure M. The shielding structure M includes a shielding frame 1 and a shielding cover 2. The shielding frame 1 is disposed on the circuit board P. The shielding frame includes a border frame 11. The shielding cover 2 is disposed on the shielding frame 1, and the shielding cover 2 is fixed to the circuit board P through the shielding frame 1. The shielding cover 2 covers a surface P1 of the circuit board P and multiple electronic components C disposed on the surface P1 to prevent mutual electromagnetic interference between multiple electronic components C and external electronic devices.

As shown in FIG. 2, a soldering portion B is on the surface P1 of the circuit board 1. The soldering portion B includes two pads B1, B2. A solder material is disposed on the two pads B1, B2, so the shielding frame 1 can be fixed to the circuit board P by soldering through the border frame 11. The border frame 11 includes a solder stopper N. The solder stopper N includes two notches N1, N2. The two notches N1, N2 are evenly positioned between the two pads B1, B2. The notch N1 is adjacent to the pad B1, and the notch N2 is adjacent to the pad B2. Specifically, the distance between the notch N1 and the pad B1 is equal to the distance between the notch N2 and the pad B2. It is noted that the number of the solder stopper N and the soldering portion B does not limit the present disclosure. The circuit board P of FIG. 1 may include multiple soldering portions B, and the border frame 11 may include multiple solder stoppers N.

Figure 3:
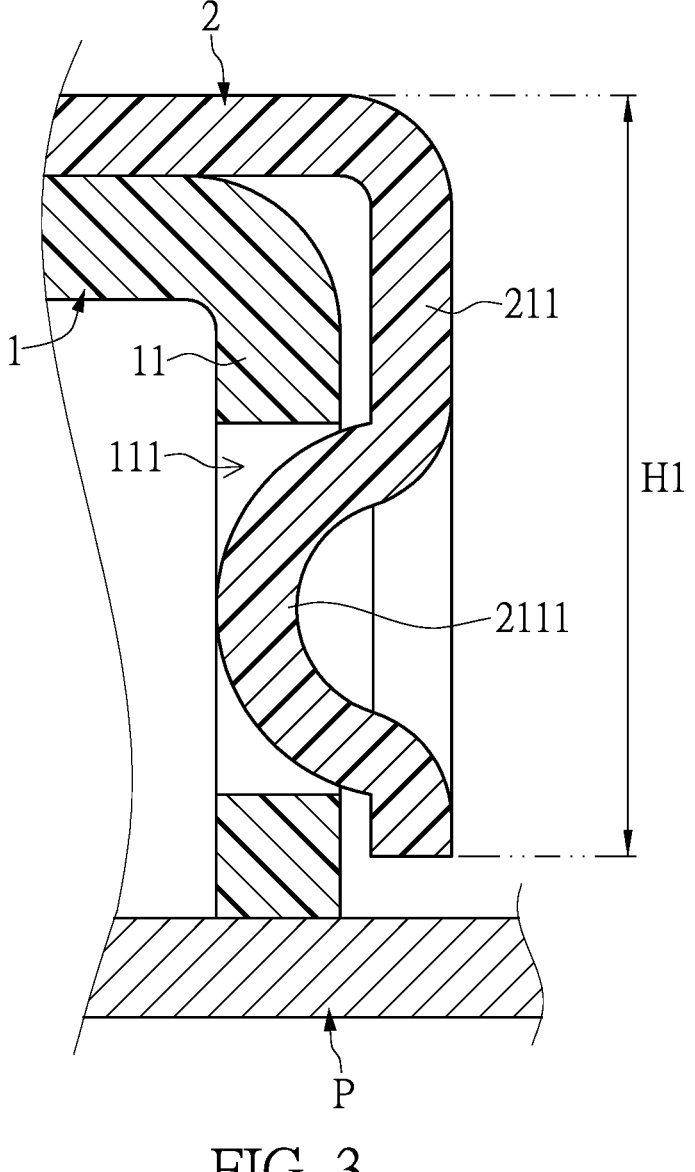
FIG. 3 is a schematic cross-sectional view of FIG. 2 along III-III cross section.
Figure 4:
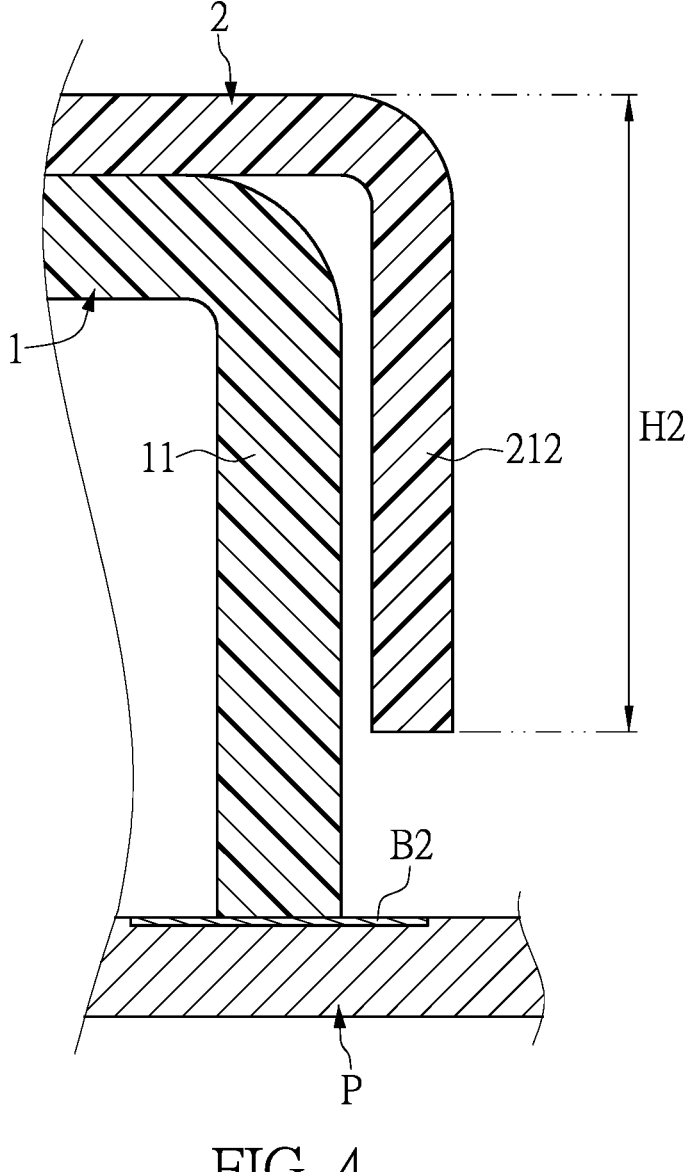
FIG. 4 is a schematic cross-sectional view of FIG. 2 along IV-IV cross section.

Refer to FIGS. 2 to 4. FIG. 3 is a schematic cross-sectional view of FIG. 2 along III-III cross section. FIG. 4 is a schematic cross-sectional view of FIG. 2 along IV-IV cross section. An outer periphery of the shielding cover 2 is further bent to form a bending portion 21. The bending portion 21 may include a cantilever structure 211 and a side wall 212, and the cantilever structure 211 has elasticity due to its own structural design. However, the number of the cantilever structures 211 and the side walls 212 does not limit the present disclosure. The border frame 11 further includes a first engagement portion 111, and the inner side of the cantilever structure 211 has a second engagement portion 2111. For example, the second engagement portion 2111 can be a protruding portion formed by the cantilever structure 211, and the first engagement portion 111 may be a groove corresponding to the protruding portion. When the shielding cover 2 is disposed on the shielding frame 1, the second engagement portion 2111 (protruding portion) can be engaged into the first engagement portion 111 (groove), thereby further securing the shielding cover 2 to the shielding frame 1. However, the shape of the first engagement portion 111 and the second engagement portion 2111 does not limit the present disclosure.

Figure 5:
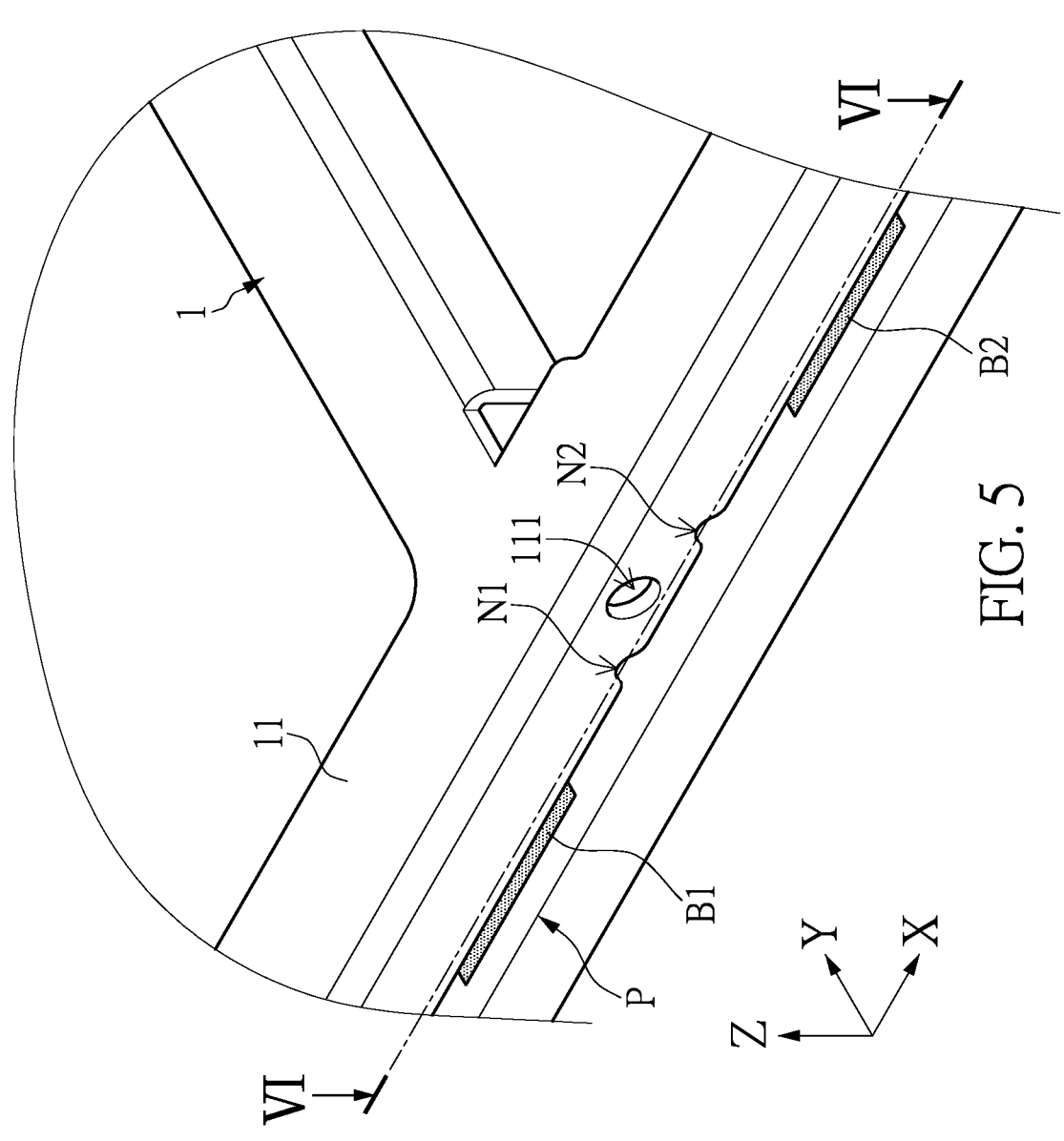
FIG. 5 is a schematic enlarged partial view of a shielding frame and the circuit board of the present disclosure.
Figure 6:
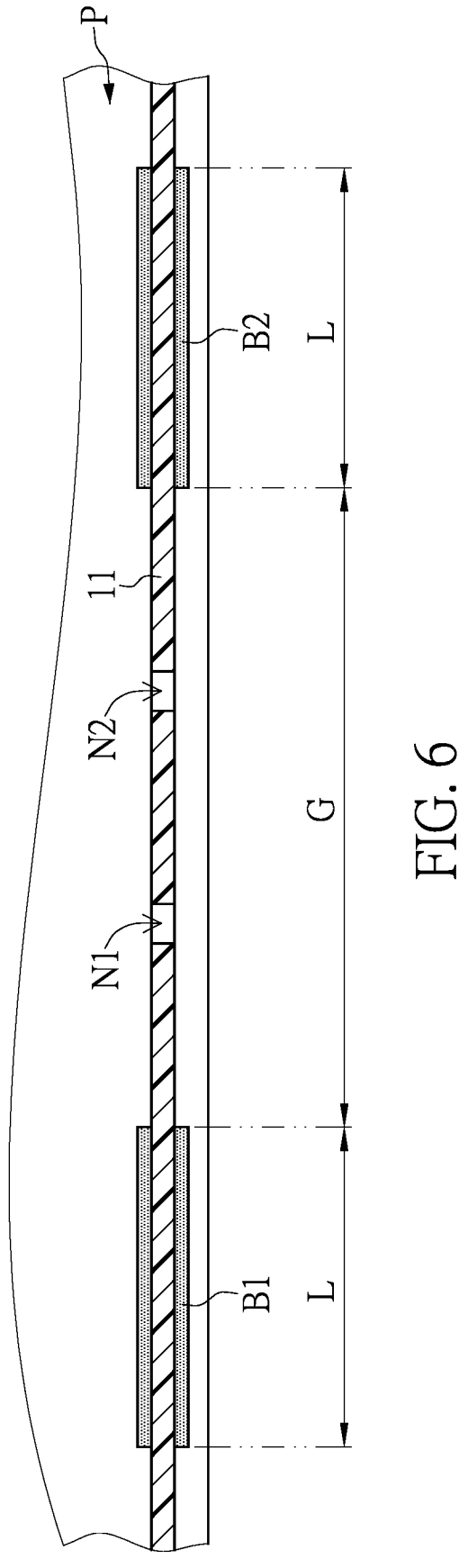
FIG. 6 is a schematic cross-sectional view of FIG. 5 along VI-VI cross section.

Refer to FIGS. 2, 5, and 6. FIG. 5 is a schematic enlarged partial view of the shielding frame and the circuit board of the present disclosure. FIG. 6 is a schematic cross-sectional view of FIG. 5 along VI-VI cross section. For ease of explanation, the shielding cover is omitted in FIG. 5. In the present disclosure, the first engagement portion 111 is disposed on the middle position between the two notches N1, N2. More specifically, the first engagement portion 111 is also located on the middle position between two pads B1, B2. The notch N1 is between the first engagement portion 111 and the pad B1, and the notch N2 is between the first engagement portion 111 and the pad B2. Therefore, when the shielding cover 2 is engaged with the first engagement portion 111 of the shielding frame 1 through the second engagement portion 2111, the cantilever structure 211 and its second engagement portion 2111 are also located in the middle position between the two pads B1 and B2. In addition, as shown in FIG. 6, a distance G is between the two pads B1, B2 of the soldering portion B, and the distance G is greater than a length L of each pad B1, B2. Preferably, the distance G is at least twice the length of each pad B1, B2.

The present disclosure utilizes a structural design with a first engagement portion 111 and a second engagement portion 2111 disposed in the middle between two pads B1 and B2, so an assembly structure formed by the first engagement portion 111 and the second engagement portion 2111 is interleaved with the two pads B1 and B2. The present disclosure further includes a design in which the distance G between the two pads B1, B2 is at least twice the length of each pad B1, B2 so that the assembly structure is spaced a certain distance apart from the two pads B1, B2. With the above design, interference between the cantilever structure 211 and the solder material on the two soldering pads B1, B2 can be prevented, and the miniaturization of the shielding structure M can be facilitated (e.g., the overall height of the shielding structure M can be reduced by more than 20% compared to existing technology). Furthermore, the present disclosure utilizes a structural design with the first engagement portion 111 and the second engagement portion 2111 disposed between two notches N1, N2, using the notches N1, N2 to separate the assembly structure from the two pads B1, B2, and preventing the solder material on the two pads B1, B2 from overflowing along the surface of the border frame 11 and interfering with the assembly of the first engagement portion 111 and the second engagement portion 2111.

In addition, in the prior art, shielding frames are designed with castle notches. However, the size of the castle notches is relatively large, making it difficult to miniaturize the shielding frame as a whole. In contrast, each notch N1, N2 of the shielding frame 1 in the present disclosure is smaller, so the shielding structure M is not limited by the size of the notches N1, N2 during miniaturization.

Refer to FIG. 6. During the process of soldering the shielding frame 1 to the circuit board P, a steel plate with an opening (not shown in the figure) is first configured at the positions of the two pads B1 and B2 on the surface of the circuit board P, and the solder material is coated to the opening. Next, the shielding frame 1 is placed on the circuit board P, and the border frame 11 is in contact with the two pads B1 and B2 and the solder material on the two pads B1 and B2. The reflow process is then carried out to fix the shielding frame 1 to the circuit board P. Subsequently, the shielding cover 2 is assembled on the shielding frame 1. It should be noted that to prevent the two notches N1, N2 of the shielding frame 1 from touching the solder material, the solder material must be coated on a position of the circuit board P away from the two notches N1, N2. Therefore, through the design of the interval G between the two pads B1, B2 to be at least twice the length of each pad B1, B2, the present disclosure can prevent the solder material from contacting the two notches N1, N2.

Figure 7:
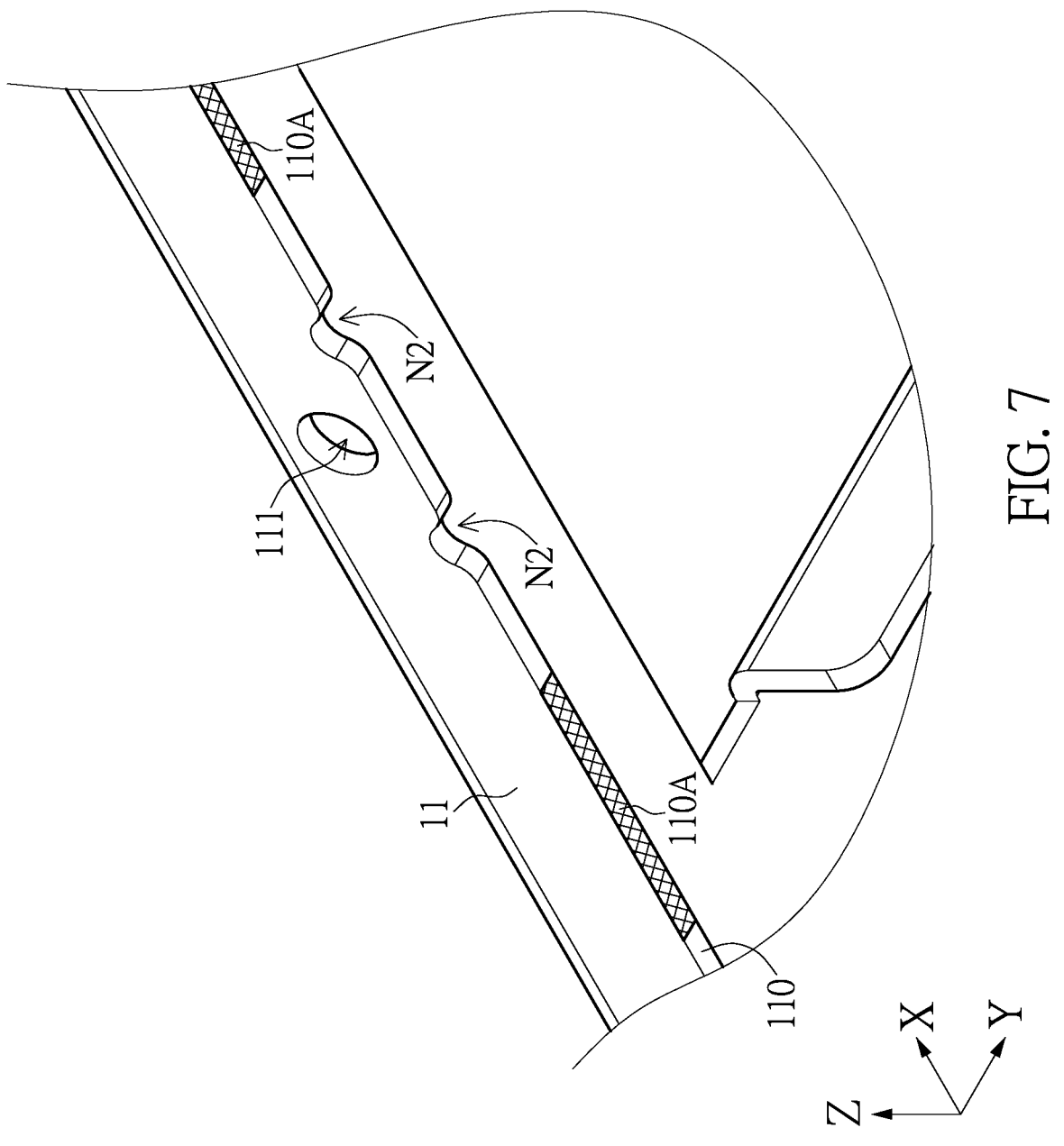
FIG. 7 is another schematic view of the shielding frame of the present disclosure.
Figure 8:
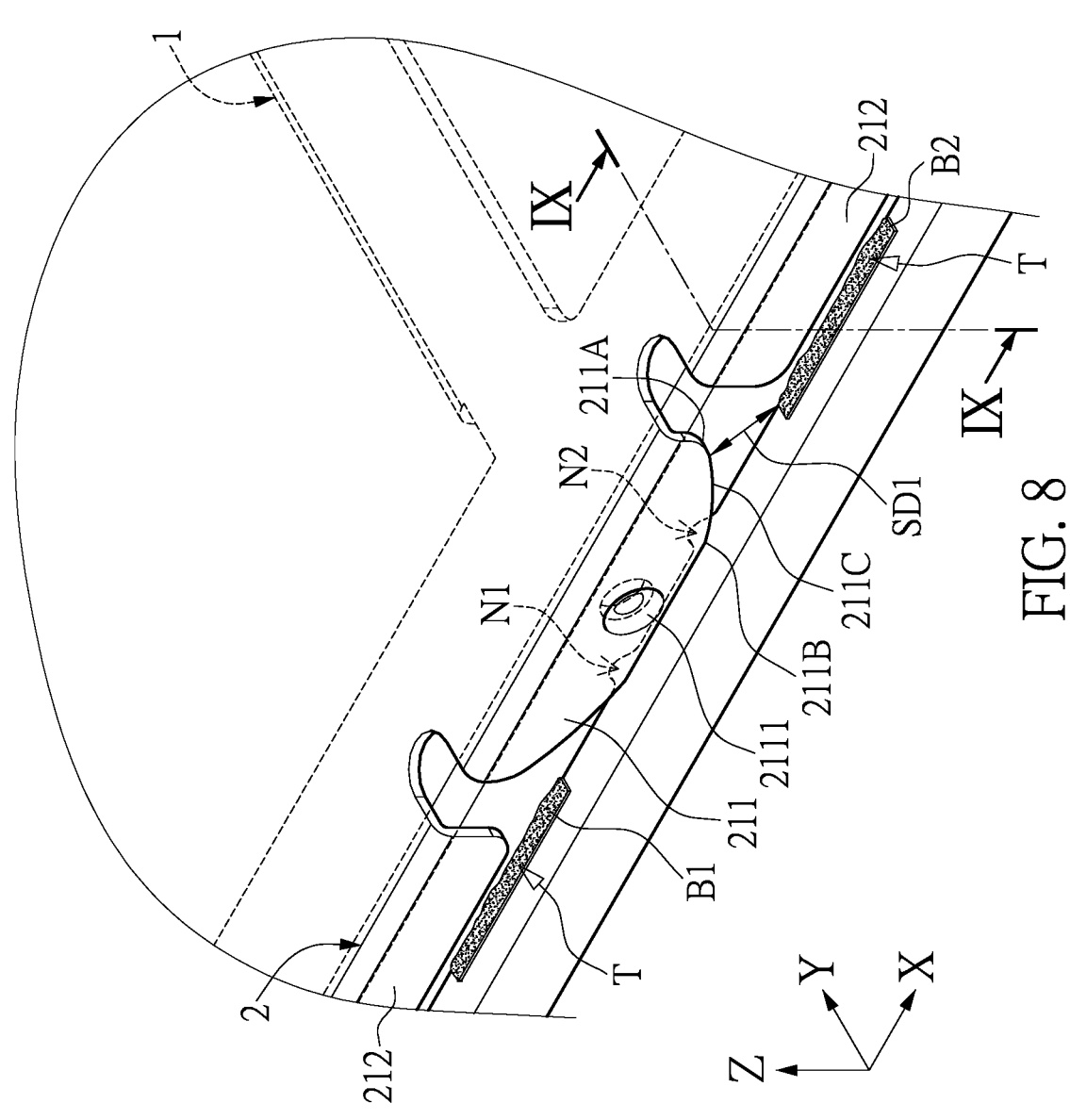
FIG. 8 is a schematic view of the shielding structure soldered to the circuit board of the present disclosure.
Figure 9:
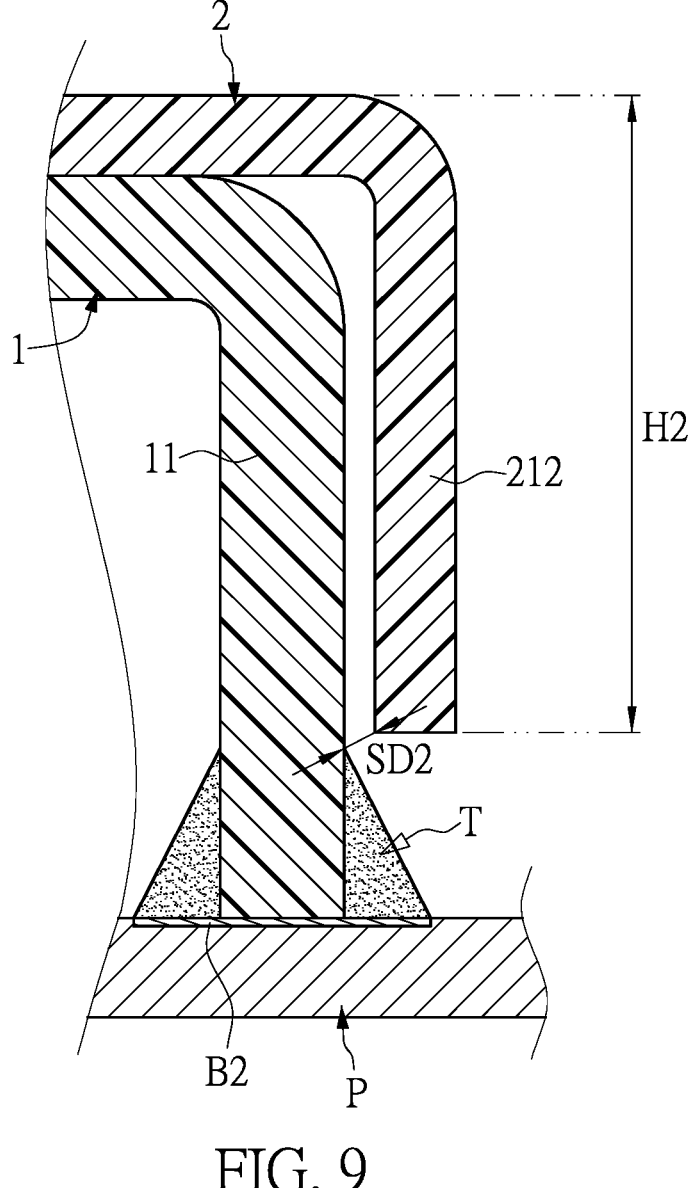
FIG. 9 is a schematic cross-sectional view of IX-IX cross section of FIG. 8.

Refer to FIGS. 7 to 9. FIG. 7 is another schematic view of the shielding frame of the present disclosure. FIG. 8 is a schematic view of the shielding structure soldered to the circuit board of the present disclosure. FIG. 9 is a schematic cross-sectional view of IX-IX cross section of FIG. 8. During the curing process, the solder material overflows along the inner and outer surfaces of the border frame 11 and is heated and cured to form a solder climbing area T. To prevent solder overflowing to the first engagement portion 111, the present disclosure utilizes two notches N1, N2 to separate between the assembly structure and the two pads B1, B2 to improve the soldering contact performance of the miniaturized shielding structure M.

Furthermore, in order to prevent interference between the side wall 212 of the shielding cover 2 and the solder climbing area T when the shielding cover 2 is assembled to the shielding frame 1 which makes assembly difficult, the side wall 212 is kept at a certain distance from the solder climbing area T. On the other hand, the shielding cover 2 is engaged to the first engagement portion 111 of the shielding frame 1 through the second engagement portion 2111 of the cantilever structure 211. The cantilever structure 211 should have a specific height to enable the user to easily move the second engagement portion 2111 to be engaged with the first engagement portion 111 with a relatively small external force. That is, the cantilever structure 211 should have sufficient height as a lever arm so that there is no need for the user to apply excessive force. Therefore, in the present embodiment, the height H1 of the cantilever structure 211 is greater than the height H2 of the side wall 212. Preferably, the difference between the length H1 and the height H2 is greater than or equal to 0.3 mm. In another embodiment, the distance between the bottom of the side wall 212 and the surface of the circuit board P is greater than or equal to 0.3 mm.

In addition, as shown in FIGS. 6 and 7, when the shielding frame 1 is soldered to the circuit board P, a portion of the bottom surface 110 of the border frame 11 is in contact with the two pads B1, B2, and the bottom surface 110 of that portion is the soldering surface 110A used to contact the two pads B1, B2. Therefore, the bottom surface 110 and the soldering surface 110A are coplanar, and the area of the bottom surface 110 of the border frame 11 is greater than the area of the soldering surface 110A. In the prior art, shielding frames are designed with castle notches. Restricted by the size of the castle notch (the width of the castle notch is about 2.5 mm), the soldering surface area of the existing shielding frames is usually smaller than the pad area on the circuit board. As a comparison, the design of the present disclosure is that each notch N1, N2 of the shielding frame 1 has a smaller size (the width is only about 0.4 mm), the bottom surface 110 and the soldering surface 110A of frame 11 are co-planar, and the area of the bottom surface 110 is greater than the area of the soldering surface 110A. Therefore, the soldering surface area between the bottom surface 110 and the circuit board P can be significantly increased. That is, the more pads are disposed on the surface of the circuit board P, the more soldering surfaces 110A the bottom surface 110 will have. In this way, the amount of solder required for the soldering between the shielding frame 1 and the circuit board P can be increased, and the structural strength of the shielding structure M is improved.

As shown in FIGS. 8 and 9, each of the two side edges of the cantilever structure 211 forms a curved contour. Specifically, the cantilever structure 211 has a bottom portion 211B and a top portion 211A, and the contour 211C between the bottom portion 211B and the top portion 211A extends upwards in an inclined curve shape. A first shortest distance SD1 is between the contour 211C and the solder climbing area T adjacent to the contour 211C, and a second shortest distance SD2 is between the side wall 212 and solder climbing area T adjacent to the side wall 212. The first shortest distance SD1 is greater than the second shortest distance SD2. Therefore, the present disclosure forms a curved contour 211C on the side edges of the cantilever structure 211, so that the cantilever structure 211 is not too close to the solder climbing areas T on both sides, further preventing interference between the cantilever structure 211 and the solder climbing areas T on the two pads B1, B2 during the assembly of the shielding frame 1 and the shielding cover 2.

Beneficial Effects of the Embodiments

One advantageous effect of the present disclosure is that the electronic device D and the shielding structure M provided by the present disclosure can improve the solder contact performance of the miniaturized shielding structure M by means of a structural feature where two notches N1, N2 are between two pads B1, B2. This prevents the solder material on the two pads B1, B2 from flowing over to the first engagement portion 111. In addition, the present disclosure forms a curved contour 211C on the side edges of the cantilever structure 211 to increase the distance between the cantilever structure 211 and the solder climbing areas T on two sides, thus further preventing interference between the cantilever structure 211 and the solder climbing areas T on the two pads B1, B2 during assembly of the shielding frame 1 and the shielding cover 2.

In addition, The present disclosure utilizes a structural design with a first engagement portion 111 and a second engagement portion 2111 disposed in the middle between two pads B1 and B2, so the assembly structure formed by the first engagement portion 111 and the second engagement portion 2111 is interleaved with the two pads B1 and B2. In addition, the present disclosure may also use a design where the interval G between the two pads B1, B2 is at least twice the length of each pad B1, B2, so that the assembly structure is spaced a certain distance apart from the two pads B1, B2, thereby preventing interference between the cantilever structure 211 and the solder material on the two pads B1, B2. This design also facilitates miniaturization of the shielding structure M, for example, reducing the overall height of the shielding structure M by more than 20% compared to existing shielding structures.

Furthermore, by the design of the shielding structure M according to the present disclosure, the number of assembly structures formed by the first engagement portion 111 and the second engagement portion 2111 needs not to be excessive. In addition, the overall height of the shielding structure M is reduced, thereby reducing the assemble stroke of the shielding cover 2 on the shielding frame 1. Therefore, the electronic device D of the present disclosure is more advantageous for assembly during production, which can reduce manufacturing costs, and improve production efficiency.

The foregoing description of the disclosure has been presented only for the purposes of illustration and description option of the exemplary embodiments and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
a circuit board with a soldering portion disposed on a surface of the circuit board, the soldering portion comprising two pads directly adjacent to each other with no intervening pad disposed therebetween;
a shielding frame disposed on the circuit board, the shielding frame comprising a border frame, the border frame being soldered to the two pads, the border frame comprising two notches, the two notches being between the two pads; and
a shielding cover disposed on the shielding frame.

2. The electronic device according to claim 1, wherein an interval is between the two pads, and the interval is greater than a length of each one of the two pads.

3. The electronic device according to claim 2, wherein the interval is at least twice the length of each one of the two pads.

4. The electronic device according to claim 2, wherein a bottom surface of the border frame and a soldering surface of the border frame in contact with each one of the two pads is co-planar, and an area of the bottom surface is greater than an area of the soldering surface.

5. The electronic device according to claim 1, wherein an outer periphery of the shielding cover forms a bending portion, the bending portion comprises a cantilever structure and a side wall, the cantilever structure has a bottom portion and a top portion, and a contour of the cantilever structure between the bottom portion and the top portion extends upward in an inclined curved shape.

6. The electronic device according to claim 5, further comprising a solder climbing area disposed on each one of the two pads, a first shortest distance being between the contour of the cantilever structure between the bottom portion and the top portion and the solder climbing area adjacent to the contour, a second shortest distance being between the side wall and the solder climbing area adjacent to the side wall, and the first shortest distance being greater than the second shortest distance.

7. The electronic device according to claim 5, wherein the border frame further comprises a first engagement portion, and the inner side of the cantilever structure has a second engagement portion, wherein the first engagement portion is engaged with the second engagement portion when the shielding cover is disposed on the shielding frame.

8. The electronic device according to claim 7, wherein the first engagement portion is disposed on a middle position between the two notches.

9. The electronic device according to claim 5, wherein a height of the cantilever structure is greater than a height of the side wall.

10. The electronic device according to claim 1, wherein a portion of a bottom surface of the border frame serves as a soldering surface that is in contact with the two pads, and the bottom surface and the soldering surface are co-planar.

11. A shielding structure disposed on a circuit board, a soldering portion is on a surface of the circuit board, the soldering portion comprising two pads directly adjacent to each other with no intervening pad disposed therebetween, the shielding structure comprising:
a shielding frame disposed on the circuit board, the shielding frame comprising a border frame, the border frame being soldered to the two pads, the border frame comprising two notches, the two notches are between the two pads; and
a shielding cover disposed on the shielding frame.

12. The shielding structure according to claim 11, wherein an outer periphery of the shielding cover forms a bending portion, the bending portion comprises a cantilever structure and a side wall, the cantilever structure has a bottom portion and a top portion, and a contour of the cantilever structure between the bottom portion and the top portion extends upward in an inclined curved shape.

13. The shielding structure according to claim 12, wherein the border frame further comprises a first engagement portion, and the inner side of the cantilever structure has a second engagement portion, wherein the first engagement portion is engaged with the second engagement portion when the shielding cover is disposed on the shielding frame.

14. The shielding structure according to claim 13, wherein the first engagement portion is disposed on a middle position between the two notches.

15. The shielding structure according to claim 12, wherein a height of the cantilever structure is greater than a height of the side wall.

16. The shielding structure according to claim 11, wherein a portion of a bottom surface of the border frame serves as a soldering surface that is in contact with the two pads, and the bottom surface and the soldering surface are co-planar.

* * * * *